United States Patent
Ngai

(10) Patent No.: US 8,323,451 B2
(45) Date of Patent: Dec. 4, 2012

(54) SYSTEM AND METHOD FOR SELF-ALIGNED DUAL PATTERNING

(75) Inventor: Christopher Siu Wing Ngai, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/100,147

(22) Filed: May 3, 2011

(65) Prior Publication Data

US 2011/0203733 A1     Aug. 25, 2011

Related U.S. Application Data

(62) Division of application No. 12/262,018, filed on Oct. 30, 2008, now Pat. No. 7,935,464.

(51) Int. Cl.
*C23F 1/08* (2006.01)
*H01L 21/36* (2006.01)
*C23C 16/00* (2006.01)

(52) U.S. Cl. .............. 156/345.32; 156/345.24; 118/719; 118/721

(58) Field of Classification Search ................ 118/719, 118/721; 156/345.32, 345.24
See application file for complete search history.

(56) References Cited

U.S. PATENT DOCUMENTS

| | | | |
|---|---|---|---|
| 7,786,015 B2 | 8/2010 | Chen et al. | |
| 2006/0014348 A1* | 1/2006 | Wu | 438/262 |
| 2006/0154388 A1* | 7/2006 | Lewington et al. | 438/17 |
| 2007/0105401 A1* | 5/2007 | Liu et al. | 438/795 |
| 2007/0134821 A1* | 6/2007 | Thakur et al. | 438/5 |
| 2009/0305506 A1 | 12/2009 | Linz | |
| 2010/0009470 A1 | 1/2010 | Davis et al. | |

* cited by examiner

*Primary Examiner* — Karla Moore
*Assistant Examiner* — Nathan K Ford
(74) *Attorney, Agent, or Firm* — Blakely Sokoloff Taylor Zafman LLP

(57) ABSTRACT

A system and a method for self-aligned dual patterning are described. The system includes a platform for supporting a plurality of process chambers. An etch process chamber coupled to the platform. An ultra-violet radiation photo-resist curing process chamber is also coupled to the platform.

14 Claims, 6 Drawing Sheets

SYSTEM AND METHOD FOR SELF-ALIGNED DUAL PATTERNING

CROSS-REFERENCE TO RELATED APPLICATIONS

This application is a divisional of U.S. patent application Ser. No. 12/262,018, filed Oct. 30, 2008, the entire contents of which are hereby incorporated by reference herein.

BACKGROUND

1) Field

Embodiments of the invention are in the field of Semiconductor Processing and, in particular a system and a method for self-aligned dual patterning.

2) Description of Related Art

For the past several decades, the scaling of features in integrated circuits has been the driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity.

Scaling has not been without consequence, however. As the dimensions of the fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features. FIGS. 1A-1C illustrate cross-sectional views representing a conventional semiconductor lithographic process, in accordance with the prior art.

Referring to FIG. 1A, a photo-resist layer 104 is provided above a semiconductor stack 102. A mask or reticle 106 is positioned above photo-resist layer 104. A lithographic process includes exposure of photo-resist layer 104 to light (hv) having a particular wavelength, as indicated by the arrows in FIG. 1A. Referring to FIG. 1B, photo-resist layer 104 is subsequently developed to provide patterned photo-resist layer 108 above semiconductor stack 102. That is, the portions of photo-resist layer 104 that were exposed to light are now removed. The width of each feature of patterned photo-resist layer 108 is depicted by the width 'x.' The spacing between each feature is depicted by the spacing 'y.' Typically, the limit for a particular lithographic process is to provide features having a critical dimension equal to the spacing between the features, e.g. x=y, as depicted in FIG. 1B.

Referring to FIG. 1C, the critical dimension (e.g. the width 'x') of a feature may be reduced to form patterned photo-resist layer 110 above semiconductor stack 102. The critical dimension may be shrunk by over-exposing photo-resist layer 104 during the lithographic step depicted in FIG. 1A or by subsequently trimming patterned photo-resist layer 108 from FIG. 1B. However, this reduction in critical dimension comes at the expense of an increased spacing between features, as depicted by spacing 'y' in FIG. 1C. That is, there may be a trade-off between the smallest achievable dimension of each of the features from patterned photo-resist layer 110 and the spacing between each feature.

DETAILED DESCRIPTION

Figure 1A:
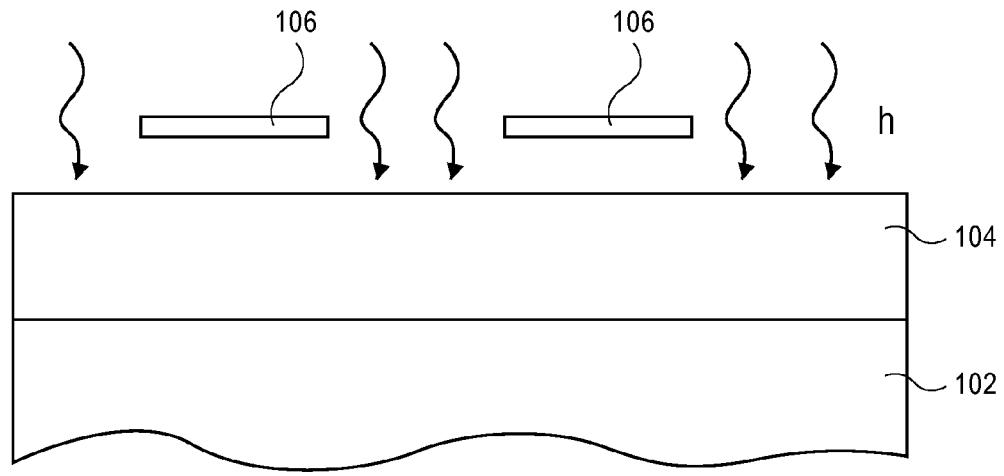
FIGS. 1A-1C illustrate cross-sectional views representing a conventional semiconductor lithographic process, in accordance with the prior art.
Figure 1B:
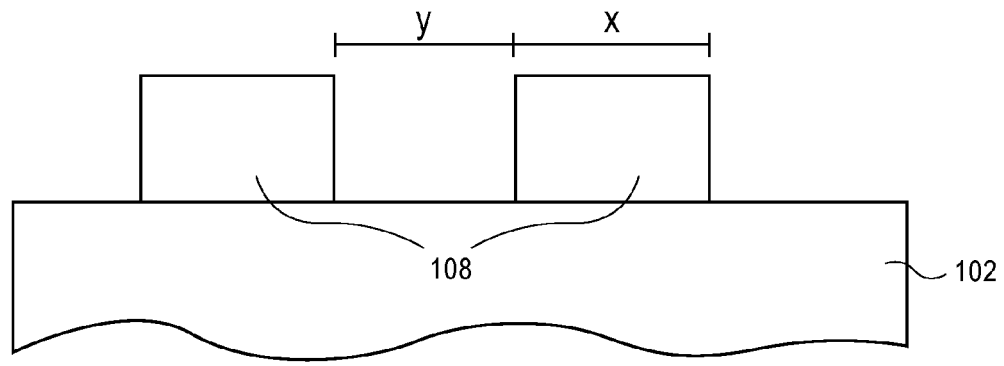
Figure 1C:
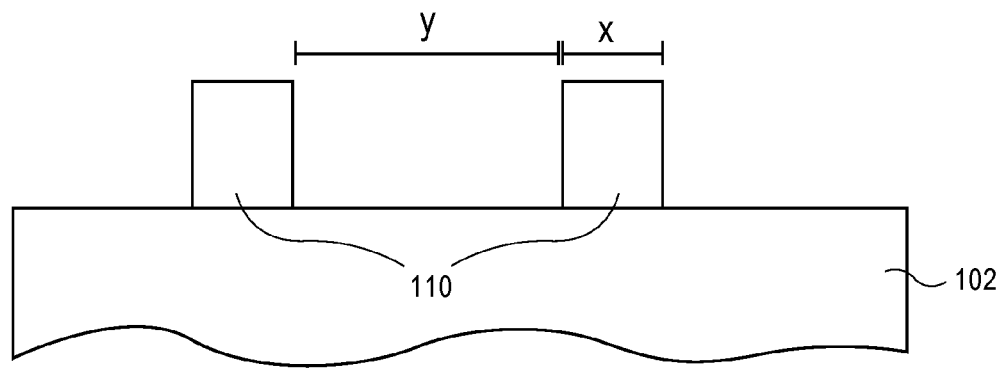

A system and a method for self-aligned dual patterning are described. In the following description, numerous specific details are set forth, such as fabrication conditions and material regimes, in order to provide a thorough understanding of the present invention. It will be apparent to one skilled in the art that the present invention may be practiced without these specific details. In other instances, well-known features, such as integrated circuit design layouts or photo-resist development processes, are not described in detail in order to not unnecessarily obscure the present invention. Furthermore, it is to be understood that the various embodiments shown in the Figures are illustrative representations and are not necessarily drawn to scale.

Disclosed herein are a system and a method for self-aligned dual patterning. A system for carrying out a self-aligned dual patterning process may include a platform for supporting a plurality of process chambers. In one embodiment, an etch process chamber and an ultra-violet radiation photo-resist curing process chamber are coupled to the platform. A method for self-aligned dual patterning may include first forming a patterned photo-resist layer on a layered structure. In one embodiment, the layered structure is then introduced to a platform supporting a plurality of process chambers. The patterned photo-resist layer is trimmed in an etch chamber coupled to the platform to provide a photo-resist template mask on the layered structure. The photo-resist template mask is then cured in an ultra-violet radiation photo-resist curing process chamber coupled to the platform to form a hardened photo-resist template mask. A spacer-forming material layer may subsequently be deposited over the hardened photo-resist template mask and then etched to form a spacer mask and to re-expose the hardened photo-resist template mask. In one embodiment, the hardened photo-resist template mask is finally removed and an image of the spacer mask is transferred to the substrate.

The use of a photo-resist template mask in a self-aligned dual patterning scheme may reduce the number of process steps required in such an integration scheme. For example, in accordance with an embodiment of the present invention, a photo-resist template mask is used as the foundation in the formation of a spacer mask. Thus, instead of first patterning a photo-resist layer and then transferring the image of the patterned photo-resist layer to a mask layer in order to form a template mask, the patterned photo-resist layer itself may be used directly as a template mask. However, in accordance with an embodiment of the present invention, the photo-resist template mask is compromised during certain process operations if not first treated to form a hardened photo-resist template mask. In one embodiment, a photo-resist template mask is treated to form a hardened photo-resist template mask prior to deposition of a spacer-forming material layer on the photo-resist template mask. In a specific embodiment, deformation (such as footing of the features in the photo-resist template mask) is impeded by hardening the photo-resist template mask prior to certain process operations. The photo-resist template mask may be hardened by exposing the mask to ultra-violet radiation in order to cure the photo-resist. In accordance with an embodiment of the present invention, the photo-resist template mask is cured in an ultra-violet radiation photo-resist curing process chamber coupled to a multi-chamber-platform cluster tool.

Figure 2:
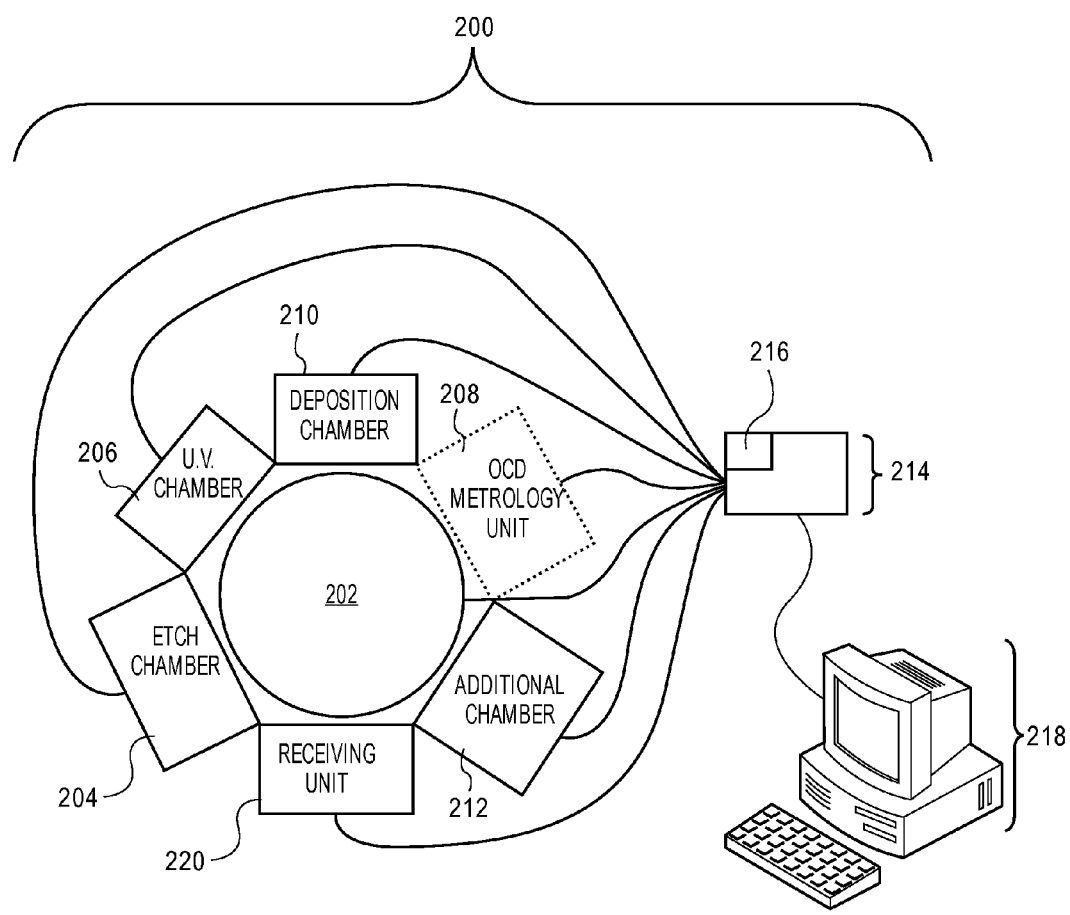
FIG. 2 illustrates a system for carrying out a self-aligned dual patterning process, in accordance with an embodiment of the present invention.

Several operations in a self-aligned dual patterning integration scheme may be carried out during a single pass in a cluster tool. FIG. 2 illustrates a system for carrying out a self-aligned dual patterning process, in accordance with an embodiment of the present invention.

Referring to FIG. 2, a cluster tool 200 includes a platform 202 for supporting a plurality of process chambers 204, 206, 208, 210 and 212. Cluster tool 200 further includes a receiving unit 220 via which a sample can be introduced into platform 202. Platform 202 may include a transfer chamber equipped with a wafer-handling robot to enable transport of a sample between the various process chambers during a single pass (one introduction) of the sample within cluster tool 200. In one embodiment, cluster tool 200 includes a computing device 214 coupled to platform 202, as depicted in FIG. 2.

Process chambers 204, 206, 208, 210 and 212 may be used to carry out particular process operations in a self-aligned dual patterning scheme. For example, in accordance with an embodiment of the present invention, an etch process chamber 204 and an ultra-violet radiation photo-resist curing process chamber 206 are coupled to platform 202. In one embodiment, both etch process chamber 204 and ultra-violet radiation photo-resist curing process chamber 206 are single-wafer process chambers. In a specific embodiment, etch process chamber 204 is equipped to generate a plasma for use in trimming the features of a photo-resist template mask. The trimming can reduce the critical dimension of the features of the photo-resist template mask following initial lithographic exposure and development of a photo-resist layer used to form the photo-resist template mask. In a particular embodiment, etch process chamber 204 is an AdvantEdge™ etch chamber and platform 202 is a Conductor Etch AdvantEdge™ platform, available from Applied Materials, Inc. In an embodiment, ultra-violet radiation photo-resist curing process chamber 206 houses an energy source capable of generating light suitable to harden (by curing) a photo-resist template mask without measurably degrading or etching the features of the photo-resist template mask. In a specific embodiment, ultra-violet radiation photo-resist curing process chamber 206 houses an energy source capable of generating light having a wavelength approximately in the range of 150-193 nanometers at an intensity approximately in the range of 12-2.5 mW/cm$^2$. In a particular embodiment, ultra-violet radiation photo-resist curing process chamber 206 houses an energy source capable of generating light having a wavelength of approximately 172 nanometers at an intensity approximately in the range of 12-2.5 mW/cm$^2$.

Computing device 214 of cluster tool 200 may be additionally coupled to a user interface 218 and to etch process chamber 204 and ultra-violet radiation photo-resist curing process chamber 206, as depicted in FIG. 2. In accordance with an embodiment of the present invention, computing device 214 includes a memory 216 having stored thereon a set of executable instructions for carrying out several operations in a self-aligned dual patterning scheme. For example, in one embodiment, the set of instructions is executable to receive a wafer in receiving unit 220 and to transfer the wafer to platform 202. In a specific embodiment, the wafer has a layer of patterned photo-resist disposed thereon. The set of instructions is executable to next move the wafer to etch process chamber 204. In a specific embodiment, the set of instructions is executable to trim the layer of patterned photo-resist in etch process chamber 204 to provide a layer of trimmed patterned photo-resist on the wafer. The set of instructions is executable to next move the wafer to ultra-violet radiation photo-resist curing process chamber 206. In a specific embodiment, the set of instructions is executable to cure the layer of trimmed patterned photo-resist in ultra-violet radiation photo-resist curing process chamber 206. In a particular embodiment, the set of instructions is executable to cure the layer of trimmed patterned photo-resist to provide a hardened photo-resist layer. In an alternative embodiment, the set of instructions is executable to first harden a layer of patterned photo-resist in ultra-violet radiation photo-resist curing process chamber 206 and then to trim the hardened layer of patterned photo-resist in etch process chamber 204.

Cluster tool 200 may also include an optical critical dimension (OCD) metrology unit 208. In accordance with an embodiment of the present invention, OCD metrology unit 208 is coupled to computing device 214, as depicted in FIG. 2. In an embodiment, memory 216 of computing device has stored thereon a set of executable instructions for moving a wafer from platform 202 to OCD metrology unit 208 in order to measure the critical dimension of the features in a layer of patterned photo-resist formed on the wafer. In one embodiment, the set of instructions is executable to measure, in OCD metrology unit 208, the critical dimension of the features in the layer of patterned photo-resist subsequent to trimming the layer of patterned photo-resist in etch process chamber 204, and prior to moving the wafer to ultra-violet radiation photo-resist curing process chamber 206. In an embodiment, OCD metrology unit 208 is coupled to platform 202, as depicted in FIG. 2. In one embodiment, OCD metrology unit 208 is equipped with an ellipsometer for determining the critical dimension of various features in a layer of patterned photo-resist. In an alternative embodiment, OCD metrology unit 208 is located external to platform 202.

Real time feedback may be obtained by measuring, in OCD metrology unit 208, the critical dimension of the features in a layer of patterned photo-resist formed on a wafer. In an embodiment, a measurement obtained in OCD metrology unit 208 is used to determine whether or not a wafer should be returned to etch process chamber 208 for additional trimming of a layer of patterned photo-resist prior to hardening the layer of patterned photo-resist in ultra-violet radiation photo-resist curing process chamber 206. In one embodiment, the determination is made based on a predetermined desired critical dimension for a particular feature in the patterned photo-resist layer vis-à-vis the measurement obtained from OCD metrology unit 208. In a specific embodiment, a measurement obtained from OCD metrology unit 208 provides information regarding critical dimension uniformity of a patterned photo-resist layer across an entire wafer. In accordance with another embodiment of the present invention, a measurement obtained from OCD metrology unit 208 is used to adjust the etching conditions used on a second wafer subsequently introduced into etch process chamber 204 for a photo-resist trimming operation. In another embodiment, a measurement obtained in OCD metrology unit 208 is used to determine the curing conditions subsequently used in ultra-violet radiation photo-resist curing process chamber 206. In that embodiment, a partial light shield may be used to vary across a wafer the exposure of a patterned photo-resist layer to ultra-violet radiation.

Additional process chambers 210 and 212 may be included in cluster tool 200 for carrying out other operations in a self-aligned dual patterning scheme. For example, in accordance with an embodiment of the present invention, a deposition chamber 210 is coupled to platform 202, as depicted in FIG. 2. In one embodiment, deposition chamber 210 is included for depositing a layer of spacer-forming material on a trimmed and hardened patterned photo-resist layer, processes which are carried out in process chambers 204 and 206, respectively.

Figure 3:
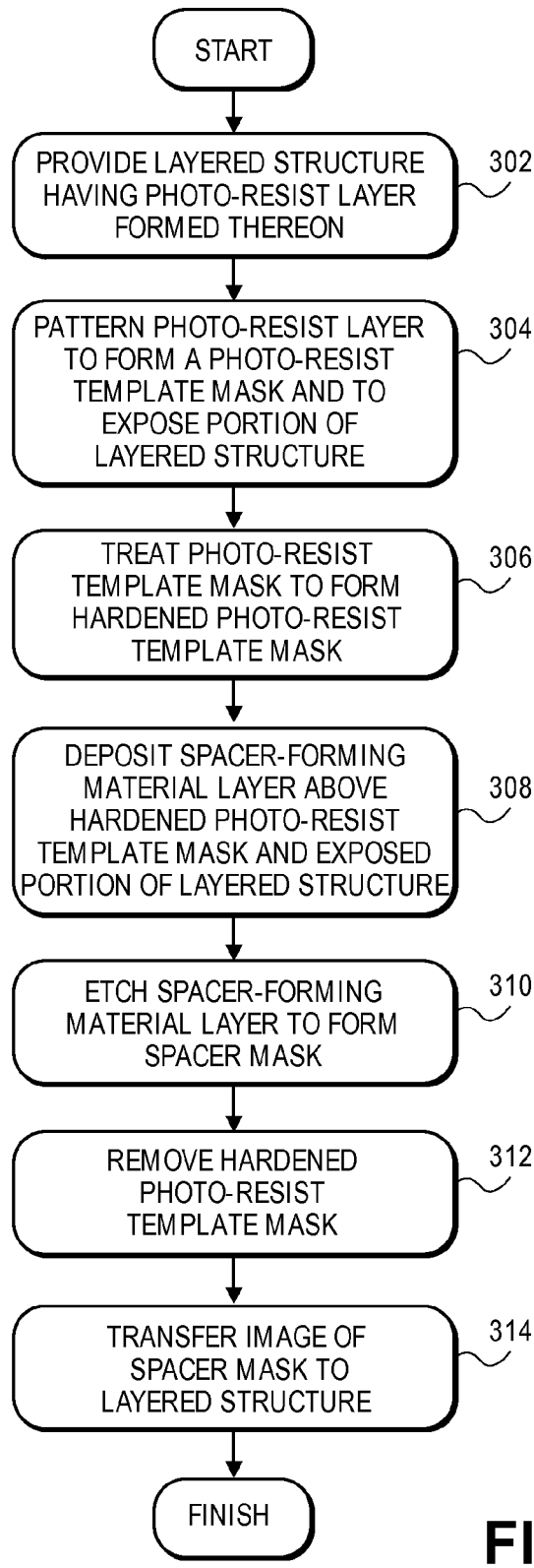
FIG. 3 is a Flowchart representing a series of operations in a self-aligned dual patterning process, in accordance with an embodiment of the present invention.

A method of self-aligned dual patterning may include a photo-resist hardening operation. FIG. 3 is a Flowchart 300 representing a series of operations in a self-aligned dual patterning process, in accordance with an embodiment of the present invention. FIGS. 4A-4H illustrate cross-sectional views representing a series of operations in a self-aligned dual patterning process, in accordance with an embodiment of the present invention.

Figure 4A:
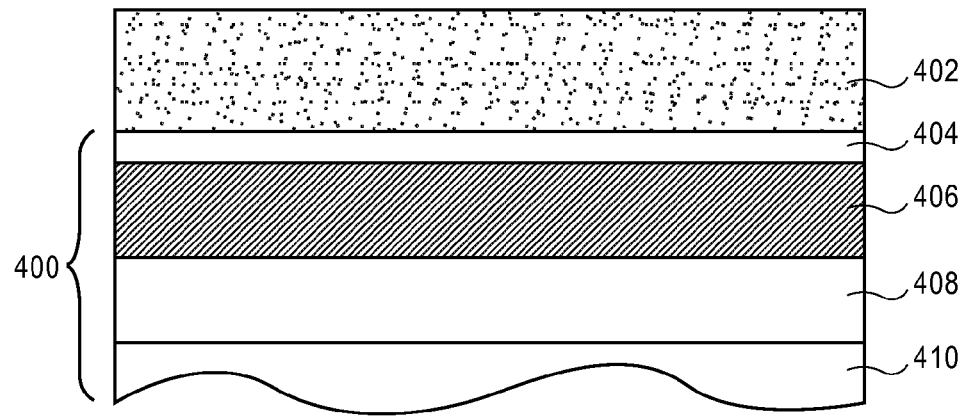
FIGS. 4A-4H illustrate cross-sectional views representing a series of operations in a self-aligned dual patterning process, in accordance with an embodiment of the present invention.

Referring to operation 302 of Flowchart 300 and corresponding FIG. 4A, a layered structure 400 is provided having a photo-resist layer 402 formed thereon. In accordance with an embodiment of the present invention, at least a portion of structure 400 will ultimately be patterned by using a process that incorporates a photo-resist template mask, such as a self-aligned dual patterning process. In one embodiment, structure 400 is a layered structure, as depicted in FIG. 4A. A device layer may be patterned by forming a photo-resist template mask directly thereon. Alternatively, a hard-mask structure which is disposed above a device layer may first be patterned and the pattern subsequently transferred from the hard-mask structure to the device layer. Thus, in a specific embodiment, structure 400 includes a first hard-mask layer 404, a second hard-mask layer 406 and a device layer 408, as depicted in FIG. 4A. In a particular embodiment, first hard-mask layer 404 and second hard-mask layer 406 are removed following a patterning process, while device layer 408 is patterned and ultimately retained in a fabricated semiconductor structure.

Photo-resist layer 402 may be composed of any material suitable for use in a lithographic process. That is, photo-resist layer 402 will ultimately be exposed to a light source and subsequently developed. In an embodiment, the portions of photo-resist layer 402 to be exposed to the light source will be removed upon developing photo-resist layer 402, e.g. photo-resist layer 402 is composed of a positive photo-resist material. In a specific embodiment, photo-resist layer 402 is composed of a positive photo-resist material such as, but not limited to, a 248 nm resist, a 193 nm resist, a 157 nm resist, an extreme ultra-violet (EUV) resist or a phenolic resin matrix with a diazonaphthoquinone sensitizer. In another embodiment, the portions of photo-resist layer 402 to be exposed to the light source will be retained upon developing photo-resist layer 402, e.g. photo-resist layer 402 is composed of a negative photo-resist material. In a specific embodiment, photo-resist layer 402 is composed of a negative photo-resist material such as, but not limited to, poly-cis-isoprene or poly-vinyl-cinnamate. The thickness of photo-resist layer 402 may be sufficiently thin to prevent spacer mask line-collapse of a subsequently fabricated spacer mask formed thereon and sufficiently thick to enable critical dimension control of the spacer mask lines. In one embodiment, the thickness of photo-resist layer 402 is approximately in the range of 4.06-5.625 times the targeted line width of a subsequently formed spacer mask.

First hard-mask layer 404 may be composed of any material suitable to withstand an etch process used to form a spacer mask based on a photo-resist template mask, e.g. suitable to protect second hard-mask layer 406 during formation of the spacer mask. In accordance with an embodiment of the present invention, a subsequently formed spacer mask is composed of silicon oxide and first hard-mask layer 404 is composed of a material selected from the group consisting of silicon nitride, amorphous silicon and poly-crystalline silicon. The thickness of first hard-mask layer 404 may be sufficiently thick to avoid pinholes that may undesirably expose second hard-mask layer 406 to an etch process used to form a spacer mask. In one embodiment, the thickness of first hard-mask layer 404 is approximately in the range of 15-40 nanometers.

Second hard-mask layer 406 may be composed of any material suitable to form a patterning mask based on the transferred image of a spacer mask. In accordance with an embodiment of the present invention, second hard-mask layer 406 has etch characteristics similar to the etch characteristics of photo-resist layer 402. Thus, in one embodiment, second hard-mask layer 406 is protected by first hard-mask layer 404 during a photo-resist layer trimming or removal process, as described in association with FIGS. 4B and 4F, respectively, below. For example, in a specific embodiment, photo-resist layer 402 and second hard-mask layer 406 are both composed substantially of carbon atoms. In one embodiment, second hard-mask layer 406 is composed essentially of a mixture of $sp^3$ (diamond-like)-, $sp^2$ (graphitic)- and $sp^1$ (pyrolitic)-hybridized carbon atoms formed from a chemical vapor deposition process using hydrocarbon precursor molecules. Such a film may be known in the art as an amorphous carbon film, an example of which is the Advanced Patterning Film™ (APF™), available from Applied Materials, Inc. In accordance with an embodiment of the present invention, second hard-mask layer 406 is an amorphous carbon film and has different thermal characteristics from the thermal characteristics of photo-resist layer 402. In one embodiment, this difference in thermal characteristics is subsequently exploited to selectively remove photo-resist layer 402 from second hard-mask layer 406 composed of an amorphous carbon film. The thickness of second hard-mask layer 406 may be any thickness suitable to provide a practical aspect ratio for use in a subsequently formed patterning mask. In a particular embodiment, the thickness of second hard-mask layer 406 is approximately in the range of 3.125-6.875 times the targeted width of each of the lines of a subsequently formed patterning mask.

Device layer 408 may be any layer suitable for device fabrication or any other structure fabrication requiring patterning with a self-aligned dual patterning process (e.g. semiconductor structures, MEMS structures and metal line structures). For example, in accordance with an embodiment of the present invention, device layer 408 is composed of a material having a thickness that can be suitably patterned into an array of distinctly defined semiconductor structures. In one embodiment, device layer 408 is composed of a material such as, but not limited to, a group IV-based material or a material. Additionally, device layer 408 may exhibit a morphology that can suitably be patterned into an array of distinctly defined semiconductor structures. In an embodiment, the morphology of device layer 408 is a morphology such as, but not limited to, amorphous, mono-crystalline and poly-crystalline. In one embodiment, device layer 408 includes charge-carrier dopant impurity atoms. In a specific embodiment, device layer 408 has a thickness approximately in the range of 50-1000 nanometers. Device layer 408 may be composed of a metal. In one embodiment, device layer 408 is composed of a metal species which may include, but is not limited to, metal nitrides, metal carbides, metal silicides, hafnium, zirconium, titanium, tantalum, aluminum, ruthenium, palladium, platinum, cobalt, copper or nickel. Device layer 408 may further be disposed above a substrate 410. Substrate 410 may be composed of a material suitable to withstand a fabrication process and upon which semiconductor layers may suitably reside. In an embodiment, substrate 410 is composed of group IV-based materials such as, but not limited to, crystalline silicon, germanium or silicon/germanium. In another embodiment, substrate 410 is composed of a III-V material. Substrate 410 may also include an insulating layer. In one embodiment, the insulating layer is composed of a material such as, but not limited to, silicon dioxide, silicon nitride, silicon oxy-nitride or a high-k dielectric layer. In an alternative embodiment, substrate 410 is composed of a flexible plastic sheet.

In a self-aligned dual patterning process, the frequency of the features in a pattern of a photo-resist template mask may be doubled by subsequently fabricating a spacer mask. For example, in accordance with an embodiment of the present invention, a spacer mask is fabricated having spacer lines formed adjacent to the sidewalls of a photo-resist template mask. That is, for every line in the photo-resist template mask, two spacer lines of the spacer mask are generated. A spacer mask providing substantially the same critical dimension (e.g. the same feature width) for each line, but having double the density of lines in a particular region, may thus be fabricated upon subsequent removal of the photo-resist template mask.

Figure 4B:
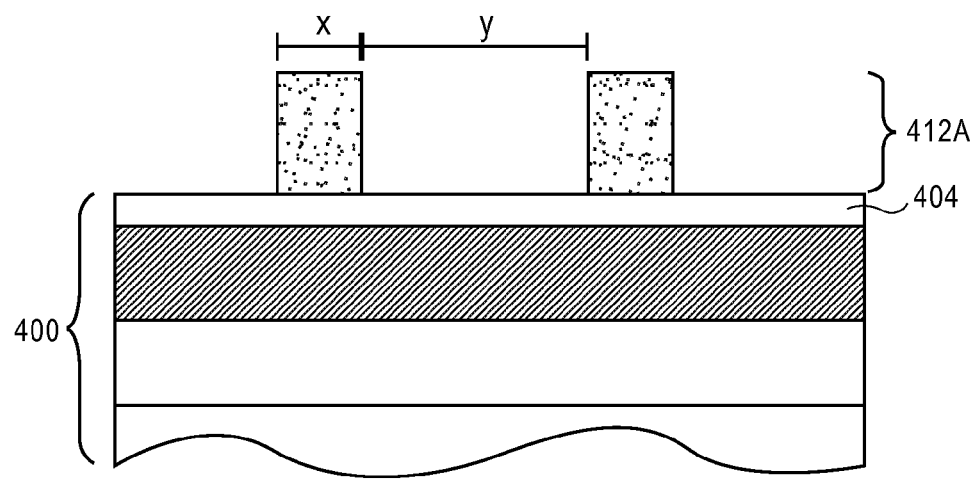

Referring to operation 304 of Flowchart 300 and corresponding FIG. 4B, photo-resist layer 402 is patterned to form a photo-resist template mask 412A. A portion of structure 400 and, in particular, a portion of the top surface of first hard-mask layer 404 is exposed upon patterning photo-resist layer 402, as depicted in FIG. 4B.

Photo-resist layer 402 may be patterned to form photo-resist template mask 412A by any method suitable to provide well-defined features for photo-resist template mask 412A, while exposing desired portions of first hard-mask layer 402. In accordance with an embodiment of the present invention, photo-resist layer 402 is patterned to form photo-resist template mask 412A by a lithographic and development process such as, but not limited to, 248 nm lithography and development, 193 nm lithography and development, 157 nm lithography and development, extreme ultra-violet (EUV) lithography and development or direct-write lithography and development.

Photo-resist template mask 412A may have any dimensions suitable for use in a spacer mask fabrication process. In accordance with an embodiment of the present invention, the width 'x' of each feature of photo-resist template mask 412A is selected to substantially correlate with the desired critical dimension of a subsequently formed semiconductor device feature. For example, in one embodiment, the width 'x' of each feature of photo-resist template mask 412A is selected to substantially correlate with the desired critical dimension of a gate electrode. In one embodiment, the width 'x' is approximately in the range of 10-100 nanometers. The spacing between lines 'y' may be selected to optimize a self-aligned dual patterning integration scheme. That is, in accordance with an embodiment of the present invention, a subsequently fabricated spacer mask is targeted such that the width of the spacer lines of the spacer mask are substantially the same as the width 'x' of each feature of photo-resist template mask 412A. Furthermore, the spacing between subsequently formed spacer lines is targeted to be substantially equal to the width of each spacer region. Thus, in one embodiment, because the frequency will ultimately be doubled, the spacing 'y' between each feature in photo-resist template mask 412A is approximately equal to 3 times the value 'x,' as depicted in FIG. 4B. That is, the pitch of photo-resist template mask 412A is selected to be approximately 4 in order to ultimately provide a spacer mask with spacer lines having a pitch of approximately 2.

The approximate 3:1 spacing:width ratio for the features of photo-resist template mask 412A may be achieved by over-exposing a positive photo-resist layer during the exposure step of a lithography process or by trimming photo-resist layer 402 subsequent to a lithographic and development process. In one embodiment, photo-resist template mask 412A is composed of 193 nm positive photo-resist that is trimmed post-development by using a plasma etch chemistry based on $O_2$ gas. Thus, in accordance with an embodiment of the present invention, the patterning of photo-resist layer 402 to form photo-resist template mask 412A includes first using a lithography exposure and development process to provide an as-developed photo-resist template mask and, subsequently, trimming the as-developed photo-resist template mask with an etch process. In one embodiment, the as-developed photo-resist template mask is trimmed in an etch process chamber coupled to a cluster tool having a platform supporting a plurality of process chambers.

In an embodiment, because the trimming process may otherwise impact second hard-mask layer 406, first hard-mask layer 404 is present to protect second hard-mask layer 406 during such a trimming process, as depicted in FIG. 4B. In accordance with an alternative embodiment of the present invention, photo-resist layer 402 is formed directly on amorphous carbon hard-mask layer 406. Thus, in that embodiment, a portion of the top surface of amorphous carbon hard-mask layer 406 is exposed upon patterning photo-resist layer 402. Accordingly, in one embodiment, because the top surface of amorphous carbon hard-mask layer 406 would be exposed upon patterning photo-resist layer 402 to form photo-resist template mask 412A, any trimming process with an $O_2$-based plasma used to trim the dimensions of photo-resist layer 402 is of a duration sufficiently short as to not significantly impact amorphous carbon hard-mask layer 406.

Although direct use of a photo-resist template mask in a self-aligned dual patterning process may eliminate the need to fabricate a template mask in a layer distinct from the photo-resist layer, care may need to be taken when subjecting the photo-resist template mask to various process conditions. For example, in accordance with an embodiment of the present invention, a photo-resist template mask is sensitive to, e.g. becomes degraded when exposed to, a spacer-forming material deposition process. Thus, in one embodiment, a photo-resist template mask is hardened prior to the deposition of a spacer-forming material.

Figure 4C:
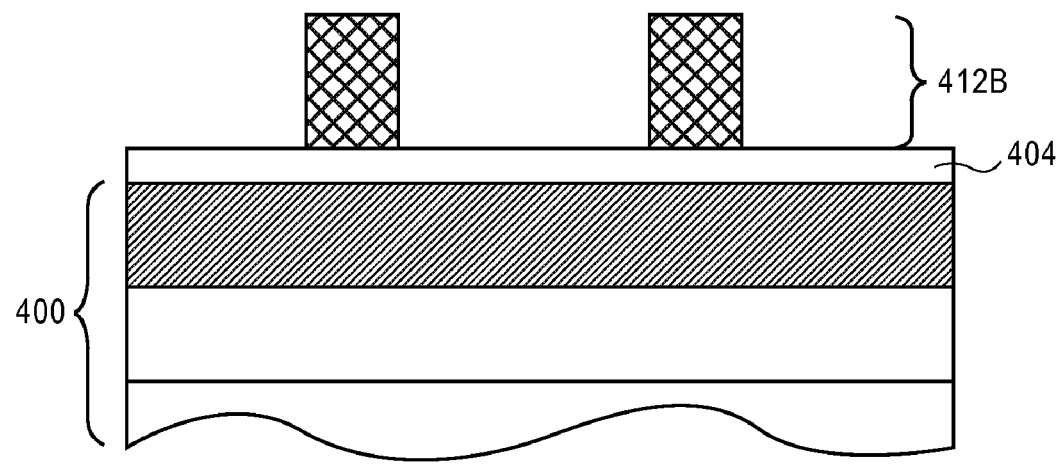

Referring to operation 306 of Flowchart 300 and corresponding FIG. 4C, photo-resist template mask 412A is treated to form hardened photo-resist template mask 412B. Thus, in accordance with an embodiment of the present invention, photo-resist template mask 412A has a first hardness while hardened photo-resist template mask 412B has a second hardness, wherein the second hardness is greater than the first hardness. In an embodiment, treating photo-resist template mask 412A to form hardened photo-resist template mask 412B includes exposing photo-resist template mask 412A to ultra-violet radiation. In one embodiment, the ultra-violet radiation cures photo-resist template mask 412A by internal cross-linking of the material of photo-resist template mask 412A. In a specific embodiment, the curing of photo-resist template mask 412A is carried out in an ultra-violet radiation photo-resist curing process chamber coupled to a platform of a cluster tool that also supports an etch process chamber used to trim a patterned photo-resist layer to form photo-resist template mask 412A. In a particular embodiment, the curing is carried out using a wavelength of light approximately in the range of 150-193 nanometers. In another particular embodiment, the curing is carried out using a wavelength of light of approximately 172 nanometers. In another embodiment treating photo-resist template mask 412A to form hardened photo-resist template mask 412B includes exposing photo-resist template mask 412A to a process such as, but not limited to, electron-beam curing, dopant implantation or heating. In accordance with an embodiment of the present invention, subsequent to trimming a patterned photo-resist layer to provide photo-resist template mask 412A and prior to hardening photo-resist template mask 412A, the critical dimension of photo-resist template mask 412A is measured in an OCD metrology unit.

Figure 4D:
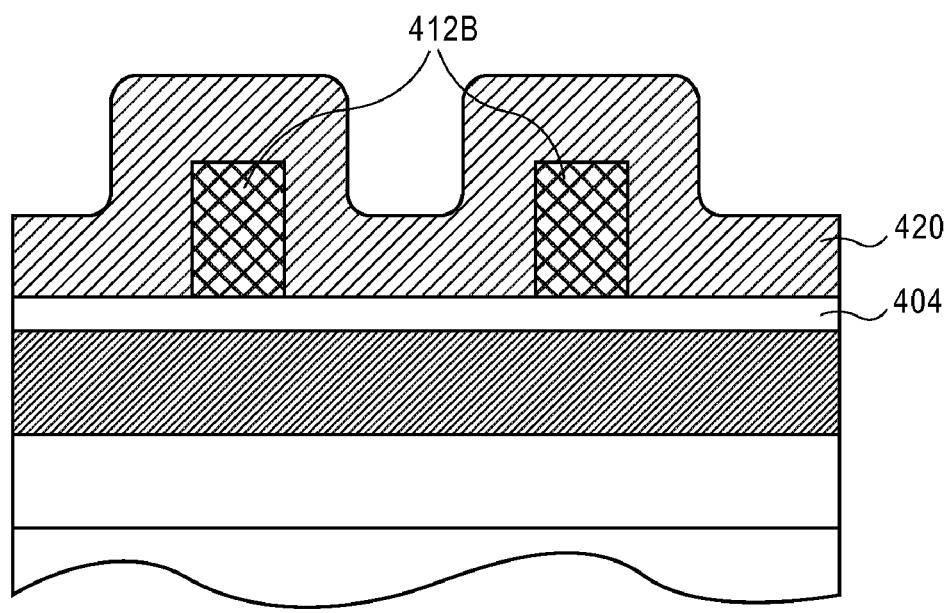

Referring to operation 308 of Flowchart 300 and corresponding FIG. 4D, a spacer-forming material layer 420 is deposited above and conformal with hardened photo-resist template mask 412B and the exposed portion of first hard-mask layer 404. Spacer-forming material layer 420 is the source of material for what will ultimately become a spacer mask for use in a self-aligned dual patterning process based on a photo-resist template mask.

Spacer-forming material layer 420 may be composed of any material compatible with hardened photo-resist template mask 412B and suitable to form a reliable mask for use in a subsequent etch process. However, although the hardening of a photo-resist template mask may aid with hindering degradation of the photo-resist template mask during spacer-forming material deposition, care may still need to be taken when subjecting the hardened photo-resist template mask to various process conditions. For example, in accordance with an embodiment of the present invention, a hardened photo-resist template mask is sensitive to, e.g. becomes degraded when exposed to, high temperature process steps. Thus, when depositing a spacer-forming material layer (the material ultimately used to form the spacer mask) on the hardened photo-resist template mask, it may be desirable to use a low-temperature deposition technique. For example, in one embodiment, spacer-forming material layer 420 is deposited at a temperature less than the glass-transition temperature of hardened photo-resist template mask 412B.

In accordance with an embodiment of the present invention, a low-temperature condensation process is used to deposit spacer-forming material layer 420 on hardened photo-resist template mask 412B. The condensation process may be any process wherein the deposition of a material layer from gaseous precursors is driven by accumulation of the resulting material layer on a surface that is cool relative to the temperature of the gaseous precursors. For example, in one embodiment, hardened photo-resist template mask 412B and structure 400 are maintained at a temperature approximately in the range of 0-100 degrees Celsius throughout the condensing of spacer-forming material layer 420 on hardened photo-resist template mask 412B. In a specific embodiment, the condensation process is carried out at a temperature approximately in the range of 0-100 degrees for a duration of less than approximately 60 seconds. In one embodiment, hardened photo-resist template mask 412B and structure 400 are maintained at a temperature less than approximately 80 degrees Celsius throughout the condensing of spacer-forming material layer 420 on hardened photo-resist template mask 412B.

In a specific embodiment, the condensation process is carried out at a temperature less than approximately 80 degrees Celsius for a duration of less than approximately 90 seconds. In a particular embodiment, spacer-forming material layer 420 is composed of silicon oxide formed by a condensation process that includes the use of ozone ($O_3$) gas. In another particular embodiment, spacer-forming material layer 420 is composed of carbon-doped silicon oxide having an atomic concentration of carbon atoms in the range of 5-15% and formed by a condensation process that includes the use of ozone gas. In an embodiment, spacer-forming material layer 420 is composed of carbon-doped silicon oxide having an atomic concentration of carbon atoms of 7%. In another embodiment, the use of a high concentration of ozone provides a highly conformal condensation deposition of spacer-forming material layer 420. In accordance with an embodiment of the present invention, spacer-forming material layer 420 is deposited in a deposition process chamber coupled to a platform that also supports process chambers used to trim and harden a patterned photo-resist layer to provide hardened photo-resist template mask 412B.

The thickness of spacer-forming material layer 420 may be selected to determine the width of the features in a subsequently formed spacer mask. Thus, in accordance with an embodiment of the present invention, the thickness of spacer-forming material layer 420 is substantially the same as the width of the features of hardened photo-resist template mask 412B, as depicted in FIG. 4D. Although for a self-aligned dual patterning process the ideal thickness of spacer-forming material layer 420 is the same as the width of the features of hardened photo-resist template mask 412B, the initial targeted width may need to be slightly thicker to compensate for an etch process used to subsequently pattern spacer-forming material layer 420. In one embodiment, the thickness of spacer-forming material layer 420 is approximately 1.06 times the width of the features of hardened photo-resist template mask 412B, e.g. 1.06 times the desired feature width of the lines in a subsequently formed spacer mask.

Figure 4E:
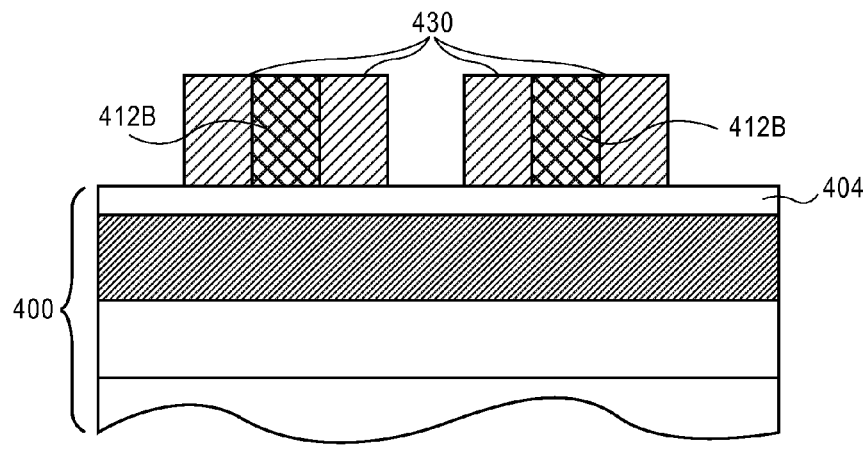

Referring to operation 310 of Flowchart 300 and corresponding FIG. 4E, spacer-forming material layer 420 is etched to provide spacer mask 430. The lines of spacer mask 430 are conformal with the sidewalls of the features of hardened photo-resist template mask 412B. Thus, there are two lines of spacer mask 430 for every line of hardened photo-resist template mask 412B. A portion of structure 400 and, in particular, a portion of the top surface of first hard-mask layer 404 is re-exposed upon etching spacer-forming material layer 420, as depicted in FIG. 4E.

Spacer-forming material layer 420 may be etched to provide spacer mask 430 by any process suitable to provide well-controlled dimensions. For example, in one embodiment, spacer-forming material layer 420 is etched to form spacer mask 430 by a process that provides a spacer width approximately equal to the critical dimension of hardened photo-resist template mask 412B. In accordance with an embodiment of the present invention, spacer-forming material layer 420 is etched until the features of hardened photo-resist template mask 412B are exposed, e.g. until all portions covering the top surface of hardened photo-resist template mask 412B are removed. In one embodiment, spacer-forming material layer 420 is etched until the lines of spacer mask 430 are substantially the same height as the features of hardened photo-resist template mask 412B, as depicted in FIG. 4E. However, in another embodiment, the lines of spacer mask 430 are recessed slightly below the top surface of the features of hardened photo-resist template mask 412B in order to ensure that the continuity of spacer-forming material layer 420 is broken above and between the lines of spacer mask 430. Spacer-forming material layer 420 may be etched such that the spacer lines of spacer mask 430 retain a substantial portion of the original thickness of spacer-forming material layer 420. In a particular embodiment, the width of the top surface of each line of spacer mask 430 is substantially the same as the width at the interface of spacer mask 430 and first hard-mask layer 404, as depicted in FIG. 4E. In accordance with an embodiment of the present invention, spacer-forming material layer 420 is etched to provide spacer mask 430 in the same etch process chamber used to trim a patterned photo-resist layer to provide photo-resist template mask 412A.

The etching of spacer-forming material layer 420 to provide spacer mask 430 may be carried out with high etch selectivity to first hard-mask layer 404 in order to protect second hard-mask layer 406. In a particular embodiment, first hard-mask layer 404 is composed of a material such as, but not limited to, silicon nitride, amorphous silicon or poly-crystalline silicon, spacer-forming material layer 420 is composed of silicon oxide or carbon-doped silicon oxide, and spacer-forming material layer 420 is etched to form spacer mask 430 using a dry etch process with a gas such as, but not limited to, $C_4F_8$, $CH_2F_2$ and $CHF_3$. In accordance with an alternative embodiment of the present invention, a first hard-mask 404 is not used. Thus, in that embodiment, spacer-forming material layer 420 is etched with substantial selectivity to an amorphous carbon hard-mask layer 406. For example, in one embodiment, the thickness of the exposed portions of amorphous carbon hard-mask layer 406 removed during the etch of spacer-forming material layer 420 is approximately in the range of 0-5% of the total thickness of amorphous carbon hard-mask layer 406. In a particular embodiment, spacer-forming material layer 420 is composed of silicon oxide or carbon-doped silicon oxide and is etched to form spacer mask 430 using a dry etch process with a gas such as, but not limited to, $C_4F_8$, $C_2F_2$ and $CHF_3$, for a duration sufficiently long to complete the etch of spacer-forming material layer 420 but sufficiently short to not substantially impact amorphous carbon hard-mask layer 406.

Figure 4F:
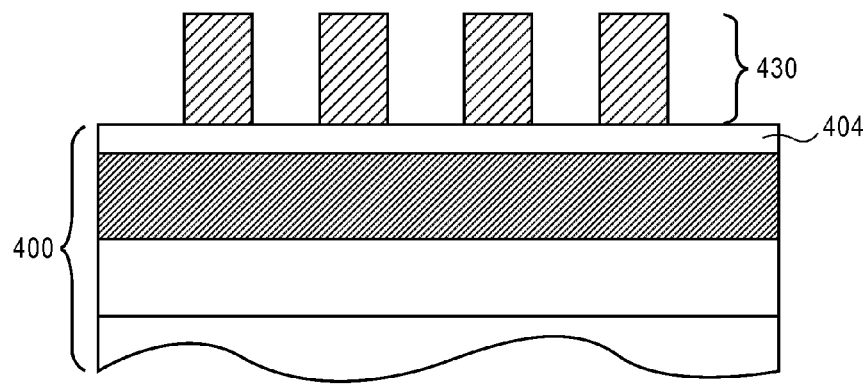

Referring to operation 312 of Flowchart 300 and corresponding FIG. 4F, hardened photo-resist template mask 412B is removed to leave only spacer mask 430 above structure 400. In accordance with an embodiment of the present invention, spacer mask 430 is used directly to pattern a device layer. In another embodiment, spacer mask 430 cannot withstand an etch process used to pattern a device layer and, accordingly, the image of spacer mask 430 is first transferred into a hard-mask layer and then into a device layer. In one embodiment, the hard-mask layer is a dual hard-mask layer. In a specific embodiment, the portion of structure 400 and, in particular, the portion of the top surface of first hard-mask layer 404 that was previously masked by hardened photo-resist template mask 412B is now exposed, as depicted in FIG. 4F.

Hardened photo-resist template mask 412B may be removed by any process suitable to entirely expose the portions of first hard-mask layer 404 previously covered by hardened photo-resist template mask 412B. In accordance with an embodiment of the present invention, hardened photo-resist template mask 412B is removed by a process that would otherwise also etch second hard-mask layer 406, but is blocked by first hard-mask 404. In one embodiment, hardened photo-resist template mask 412B is removed by an etch or an ash process using a plasma based on $O_2$ gas. In accordance with another embodiment of the present invention, hardened photo-resist template mask 412B is removed by way of a sublimation process. A sublimation process may be a physical transformation, as opposed to a chemical transformation such as an etch process. A sublimation process used to remove hardened photo-resist template mask 412B may be any process that ultimately converts hardened photo-resist template mask 412B to the gas-phase. Thus, although the term sublimation is conventionally used to describe the direct conversion from solid to gas phase, herein, any process which ultimately leads to a gas-phase removal of hardened photo-resist template mask 412B may be characterized as a sublimation process. Thus, in accordance with an embodiment of the present invention, hardened photo-resist template mask 412B is heated until gaseous, but upon heating the material exhibits an intermediate phase prior to becoming gaseous such as, but not limited to, a liquid-phase or glass-phase. In a specific embodiment, hardened photo-resist template mask 412B is removed by heating to a temperature of approximately 550 degrees Celsius. In another specific embodiment, hardened photo-resist template mask 412B is removed by heating to a temperature sufficiently low and for a duration sufficiently short as to not significantly modify the properties and dimensions of spacer mask 430 previously formed by a condensation process. Additionally, hardened photo-resist template mask 412B may be composed of a polymer and may not classically be defined as a solid material. Nonetheless, the term sublimation is used herein to also describe conversion to the gas-phase of hardened photo-resist template mask 412B composed of a polymer.

In accordance with an alternative embodiment of the present invention, a hardened photo-resist template mask is formed directly on an amorphous carbon hard-mask layer. Because the hardened photo-resist template mask may have similar etch characteristics as the etch characteristics of the amorphous carbon hard-mask layer, it may be impractical to remove the hardened photo-resist template mask by an etch process. In one embodiment, however, the thermal properties of a photo-resist template mask are substantially different from the thermal properties of an amorphous carbon hard-mask layer. This difference in thermal properties may be exploited to selectively remove a photo-resist template mask from an amorphous carbon hard-mask layer. In a specific embodiment, a photo-resist template mask is removed with high selectivity to an exposed amorphous carbon hard-mask layer by way of a sublimation process, as described above.

Figure 4G:
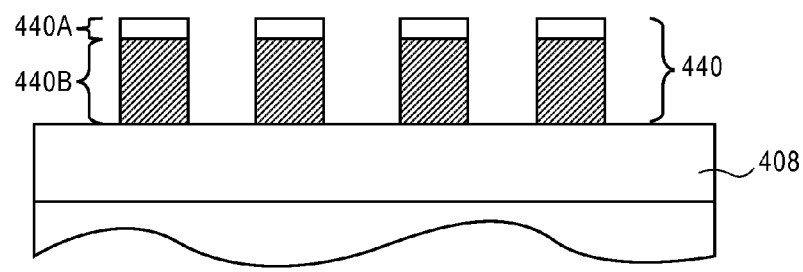

Referring to operation 314 of Flowchart 300 and corresponding FIG. 4G, the image of spacer mask 430 is transferred to first and second hard-mask layers 404 and 406, respectively, to form patterning mask 440 in structure 400. Patterning mask 440 includes a first hard-mask portion 440A and a second hard-mask portion 440B.

Figure 4H:
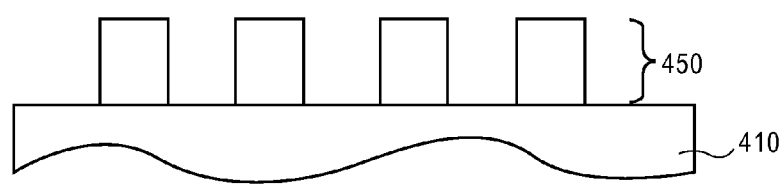

The image of spacer mask 430 may be transferred to first and second hard-mask layers 404 and 406 by any process suitable to reliably maintain the pattern and dimensions of spacer mask 430 during the transfer process. In one embodiment, the image of spacer mask 430 is transferred to first and second hard-mask layers 404 and 406 in a single-step etch process. In accordance with another embodiment of the present invention, the image of spacer mask 430 is transferred into first hard-mask layer 404 and second hard-mask layer in two distinct etch steps, respectively. In one embodiment, first hard-mask layer 404 is composed substantially of amorphous or poly-crystalline silicon and is etched to form first hard-mask portion 440A with a dry etch using the gas $CHF_3$. In another embodiment, first hard-mask layer 404 is composed substantially of silicon nitride and is etched to form first hard-mask portion 440A with a dry etch using gases such as, but not limited to, $C_4F_8$, $Cl_2$ or HBr. Next, the image of spacer mask 430 is transferred from first hard-mask portion 440A to second hard-mask layer 406 in a second etch step. Second hard-mask layer 406 and, hence, second hard-mask 440B of patterning mask 440 may be composed of any material suitable for substantially withstanding an etch process used to subsequently pattern device layer 408. In one embodiment, second hard-mask layer 406 is composed essentially of amorphous carbon and is patterned with the image of spacer mask 430 by any etch process that maintains a substantially vertical profile for each of the lines of patterning mask 440, as depicted in FIG. 4G. In a particular embodiment, second hard-mask layer 406 is composed of amorphous carbon and is etched to form second hard-mask portion 440B of patterning mask 440 with a dry etch process using a plasma based on gases such as, but not limited to, the combination of $O_2$ and $N_2$ or the combination of $CH_4$, $N_2$ and $O_2$. Spacer mask 430 may also be removed, as depicted in FIG. 4G. In accordance with an embodiment of the present invention, spacer mask 430 is removed by an etch process similar to the etch process used to etch spacer-forming material layer 420 to provide spacer mask 430, as described in association with FIG. 4E. Thus, in one embodiment, spacer mask 430 is removed by an etch process using a gas such as, but not limited to, $C_4F_8$, $CH_2F_2$ or $CHF_3$. The image of patterning mask 440 may then be transferred to device layer 408 to provide patterned device layer 450 above substrate 410, as depicted in FIG. 4H.

In the above self-aligned dual patterning scheme, prior to transferring the image of spacer mask 430 to first and second hard-mask layers 404 and 406, it may be desirable to first crop spacer mask 430 to form a cropped spacer mask. For example, in the etch step used to form spacer mask 430 described in association with FIG. 4E, spacer lines from spacer mask 430 were made discontinuous between neighboring lines of hardened photo-resist template mask 412B. However, spacer lines of spacer mask 430 associated with the same line from hardened photo-resist template mask 412B remain continuous around the ends of each of the lines of hardened photo-resist template mask 412B. Thus, in accordance with another embodiment of the present invention, the continuity between pairs of spacer lines in spacer mask 430 is broken around the ends of the lines of hardened photo-resist template mask 412B to enable more flexibility in design lay-outs for subsequent semiconductor device manufacture. In an embodiment, a layer of photo-resist is deposited and patterned above spacer mask 430 and hardened photo-resist template mask 412B. In one embodiment, the ends of the spacer lines from spacer mask 430 are etched to form a cropped spacer mask prior to the removal of hardened photo-resist template mask 412B. In a specific embodiment, the photo-resist layer used in the cropping process is subsequently removed at the same time as the removal of hardened photo-resist template mask 412B.

Also in the above self-aligned dual patterning scheme, when forming spacer mask 430, it may be desirable to retain more than only the portion of spacer-forming material layer 420 that is conformal with the sidewalls of hardened photo-resist template mask 412B. Thus, in accordance with another embodiment of the present invention, area-preservation regions are retained during the formation of spacer mask 430. In an embodiment, a layer of photo-resist is deposited above spacer-forming material layer 430 prior to etching. A portion of spacer-forming material layer 430 that would otherwise be removed in the etch step used to form a spacer mask is retained in such an area-preservation process. Thus, a spacer mask may include an area-preservation portion. In a particular embodiment, the photo-resist layer used in the area-preservation process is removed at the same time as the removal of hardened photo-resist template mask 412B.

Thus, a system and a method for self-aligned dual patterning have been disclosed. In accordance with an embodiment of the present invention, a system includes a platform for supporting a plurality of process chambers. An etch process chamber and an ultra-violet radiation photo-resist curing process chamber are coupled to the platform. In accordance with another embodiment of the present invention, a method for self-aligned dual patterning includes forming a patterned photo-resist layer on a layered structure. The layered structure is then introduced to a platform supporting a plurality of process chambers. The patterned photo-resist layer is trimmed in an etch chamber coupled to the platform to provide a photo-resist template mask on the layered structure. The photo-resist template mask is cured in an ultra-violet radiation photo-resist curing process chamber coupled to the platform to form a hardened photo-resist template mask. A spacer-forming material layer is then deposited over the hardened photo-resist template mask and is subsequently etched to form a spacer mask and to expose the hardened photo-resist template mask. Finally, the hardened photo-resist template mask is removed and an image of the spacer mask is transferred to the layered structure.

What is claimed is:

1. A system for carrying out a self-aligned dual patterning process, comprising:
   a platform for supporting a plurality of process chambers;
   an etch process chamber coupled to said platform;
   an ultra-violet radiation photo-resist curing process chamber coupled to said platform;
   a deposition process chamber coupled to said platform; and
   a computing device coupled to said platform, to said etch process chamber, to said deposition process chamber, and to said ultra-violet radiation photo-resist curing process chamber, wherein said computing device has a memory with a set of instructions stored thereon, and wherein said set of instructions is executable to carry out a method comprising:
      trimming, in said etch process chamber, a patterned photo-resist layer above a wafer to provide the wafer comprising a photo-resist template mask on a layered structure;
      curing, in said ultra-violet radiation photo-resist curing process chamber, said photo-resist template mask to form a hardened photo-resist template mask;
      depositing, in said deposition process chamber, a spacer-forming material layer over said hardened photo-resist template mask;
      etching, in said etch process chamber or in a second etch process chamber coupled to said platform, said spacer-forming material layer to form a spacer mask and to expose said hardened photo-resist template mask;
      removing said hardened photo-resist template mask; and
      transferring an image of said spacer mask to said layered structure.

2. The system of claim 1, wherein both said etch process chamber and said ultra-violet radiation photo-resist curing process chamber are single-wafer process chambers.

3. The system of claim 2, wherein said deposition process chamber is also a single-wafer process chamber.

4. The system of claim 1, further comprising:
   an optical critical dimension metrology unit coupled to said computing device, said method further comprising:
      subsequent to trimming said layer of patterned photo-resist and prior to curing said photo-resist template mask, moving said wafer to said optical critical dimension metrology unit; and measuring the critical dimension of said photo-resist template mask in said optical critical dimension metrology unit.

5. The system of claim 4, wherein said optical critical dimension metrology unit is coupled to said platform.

6. The system of claim 1, wherein said ultra-violet radiation photo-resist curing process chamber houses an energy source capable of generating light having a wavelength approximately in the range of 150-193 nanometers at an intensity approximately in the range of 2.5-12 mW/cm$^2$.

7. A system for carrying out a self-aligned dual patterning process, comprising:
   a platform for supporting a plurality of process chambers;
   an etch process chamber coupled to said platform;
   a photo-resist treatment process chamber coupled to said platform; and
   a computing device coupled to said platform, to said etch process chamber, and to said photo-resist treatment process chamber, wherein said computing device has a memory with a set of instructions stored thereon, and wherein said set of instructions is executable to carry out a method comprising:
      patterning, in said etch process chamber, a patterned photo-resist layer above a device layer on a substrate to provide the substrate comprising a photo-resist template mask above the device layer, the photo-resist template mask having a first hardness;
      treating, in said photo-resist treatment process chamber, said photo-resist template mask to form a hardened photo-resist template mask having a second hardness greater than said first hardness;
      depositing a spacer-forming material layer over said hardened photo-resist template mask;
      etching said spacer-forming material layer to form a spacer mask and to expose said hardened photo-resist template mask;
      removing said hardened photo-resist template mask; and
      transferring an image of said spacer mask to said device layer on said substrate.

8. The system of claim 7, wherein both said etch process chamber and said photo-resist treatment process chamber are single-wafer process chambers.

9. The system of claim 7, further comprising:
   an optical critical dimension metrology unit coupled to said computing device, said method further comprising:
      subsequent to patterning said patterned photo-resist layer and prior to treating said photo-resist template mask, moving said substrate to said optical critical dimension metrology unit; and
      measuring the critical dimension of said photo-resist template mask in said optical critical dimension metrology unit.

10. The system of claim 9, wherein said optical critical dimension metrology unit is coupled to said platform.

11. The system of claim 7, wherein the photo-resist treatment process chamber is for performing a process selected from the group consisting of electron-beam curing, dopant implantation, heating, and ultra-violet radiation curing.

12. The system of claim 7, wherein said photo-resist treatment process chamber is for ultra-violet radiation curing and houses an energy source capable of generating light having a wavelength approximately in the range of 150-193 nanometers at an intensity approximately in the range of 2.5-12 mW/cm$^2$.

13. The system of claim 7, further comprising a deposition process chamber coupled to said platform, wherein depositing said spacer-forming material layer over said hardened photo-resist template mask is performed in said deposition process chamber.

14. The system of claim 13, wherein said deposition process chamber is a single-wafer process chamber.

* * * * *